(12) United States Patent
Kim

(10) Patent No.: US 7,596,046 B2
(45) Date of Patent: Sep. 29, 2009

(54) DATA CONVERSION CIRCUIT, AND SEMICONDUCTOR MEMORY APPARATUS USING THE SAME

(75) Inventor: Jae-Heung Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 64 days.

(21) Appl. No.: 11/826,488

(22) Filed: Jul. 16, 2007

(65) Prior Publication Data

US 2008/0112247 A1     May 15, 2008

(30) Foreign Application Priority Data

Nov. 15, 2006     (KR) .................... 10-2006-0112619

(51) Int. Cl.
*G11C 7/00*     (2006.01)
(52) U.S. Cl. .................... 365/219; 365/233.5
(58) Field of Classification Search .............. 365/219, 365/233.5
See application file for complete search history.

(56) References Cited

U.S. PATENT DOCUMENTS

| | | | | |
|---|---|---|---|---|
| 5,508,967 | A * | 4/1996 | Karino ................ | 365/219 |
| 6,282,150 | B1 * | 8/2001 | Edo .................. | 365/233.13 |
| 6,317,377 | B1 * | 11/2001 | Kobayashi .......... | 365/220 |
| 6,335,889 | B1 * | 1/2002 | Onodera ............. | 365/221 |
| 6,466,490 | B2 * | 10/2002 | Nagai et al. ........ | 365/189.12 |
| 6,498,741 | B2 * | 12/2002 | Matsudera et al. ... | 365/63 |
| 6,570,800 | B2 * | 5/2003 | Tanaka et al. ....... | 365/219 |
| 6,801,144 | B2 * | 10/2004 | Matsudera et al. ... | 341/100 |
| 7,006,402 | B2 | 2/2006 | Park et al. | |
| 7,016,255 | B2 | 3/2006 | Lee et al. | |
| 7,016,346 | B1 * | 3/2006 | Alowersson et al. ... | 370/363 |
| 7,089,465 | B2 | 8/2006 | Lee | |
| 2001/0007539 | A1 * | 7/2001 | Tanaka et al. ........ | 365/230.03 |
| 2001/0026475 | A1 * | 10/2001 | Kanazashi ........... | 365/189.07 |
| 2005/0033875 | A1 * | 2/2005 | Cheung et al. ........ | 710/29 |
| 2005/0047255 | A1 | 3/2005 | Park et al. | |
| 2005/0073903 | A1 * | 4/2005 | Fujioka et al. ........ | 365/233 |
| 2005/0185497 | A1 * | 8/2005 | Ikeda et al. ........... | 365/230.06 |
| 2005/0268167 | A1 | 12/2005 | Huott et al. | |
| 2005/0270870 | A1 * | 12/2005 | Shin et al. ........... | 365/202 |
| 2005/0271045 | A1 * | 12/2005 | Mo ................... | 370/366 |
| 2006/0221757 | A1 | 10/2006 | Kim | |

FOREIGN PATENT DOCUMENTS

| | | |
|---|---|---|
| JP | 2004362760 | 12/2004 |
| JP | 2005136455 | 5/2005 |
| JP | 2005322375 | 11/2005 |
| KR | 1020000046821 | 7/2000 |

* cited by examiner

*Primary Examiner*—Michael T Tran
(74) *Attorney, Agent, or Firm*—Venable LLP; Jeffri A. Kaminski

(57) ABSTRACT

A data conversion circuit for a semiconductor memory apparatus includes a data conversion unit that has a plurality of latches for storing input data and outputting stored data as output data in response to a clock, and an operation mode selection unit that selects either a first operation mode to convert serial data to parallel data during a write operation or a second operation mode to convert parallel data to serial data during a read operation, to thereby drive the data conversion unit.

29 Claims, 5 Drawing Sheets

DATA CONVERSION CIRCUIT, AND SEMICONDUCTOR MEMORY APPARATUS USING THE SAME

CROSS-REFERENCE TO RELATED PATENT APPLICATION

This application claims the benefit of Korean Patent Application No. 10-2006-0112619, filed on Nov. 15, 2006, in the Korean Intellectual Property Office, the disclosure of which is incorporated herein in its entirety by reference.

BACKGROUND OF THE INVENTION

1. Technical Field

The present invention relates to a semiconductor memory apparatus, and in particular, to a data conversion circuit of a semiconductor memory apparatus, a semiconductor memory apparatus using the same, and a data conversions method.

2. Related Art

Generally, a semiconductor memory apparatus receives serial data through a single input path. The semiconductor memory apparatus internally converts serial data to parallel data and stores the converted parallel data in memory cells. When the stored data is output, parallel data is converted to serial data. Accordingly, in order to input data to and store data in the semiconductor memory apparatus, an apparatus that converts serial data to parallel data is required. Further, in order to output data from the semiconductor memory apparatus, an apparatus that converts parallel data to serial data is required. That is, the semiconductor memory apparatus requires two circuits, one that converts serial data to parallel data, and one that converts parallel data to serial data.

As shown in FIG. 1, in a general DDR2 SDRAM, a 4-bit pre-fetch method is used in which data is converted by 4 bits at a time.

During a write operation, the semiconductor memory apparatus receives serial data 4-bit Serial Data from an input/output pad 60. The serial data 4-bit Serial Data is converted to parallel data 4-bit Parallel Data by a serial-to-parallel data conversion unit 50, and then the parallel data is transmitted to first to fourth input/output lines GIO_Q<0:3>.

Meanwhile, during a read operation, parallel data 4-bit Parallel Data that is transmitted through the first to fourth input/output lines GIO_Q<0:3> is converted to serial data 4-bit Serial Data by a parallel-to-serial data conversion unit 20, and then the serial data is transmitted to an output driver 30.

As such, in the general semiconductor memory apparatus, the serial-to-parallel data conversion unit 50 and the parallel-to-serial data conversion unit 20 are used to transmit and receive internal data and external data of the semiconductor memory apparatus.

However, since the conventional semiconductor memory apparatus includes a data conversion circuit that converts serial data to parallel data, and a data conversion circuit that converts parallel data to serial data, each circuit occupies a predetermined area. This results in a decrease in integration of the semiconductor memory apparatus.

SUMMARY OF THE INVENTION

An embodiment of the present invention provides a data conversion circuit that can convert serial data to parallel data and convert parallel data to serial data using a single data conversion circuit.

Another embodiment of the present invention provides a semiconductor memory apparatus that can reduce an area where a data conversion circuit is disposed.

Still another embodiment of the present invention provides a data conversion method that can convert serial data to parallel data and convert parallel data to serial data using a single data conversion circuit.

According to an embodiment of the present invention, a data conversion circuit of a semiconductor memory apparatus includes a data conversion unit that has a plurality of latches for storing input data and outputting stored data as output data in response to a clock, and an operation mode selection unit that selects either a first operation mode to convert serial data to parallel data during a write operation or a second operation mode to convert parallel data to serial data during a read operation, to thereby drive the data conversion unit.

DESCRIPTION OF EXEMPLARY EMBODIMENT

Hereinafter, an exemplary embodiment of a data conversion circuit of a semiconductor memory apparatus according to the present invention will be described in detail with reference to the accompanying drawings.

Figure 1:
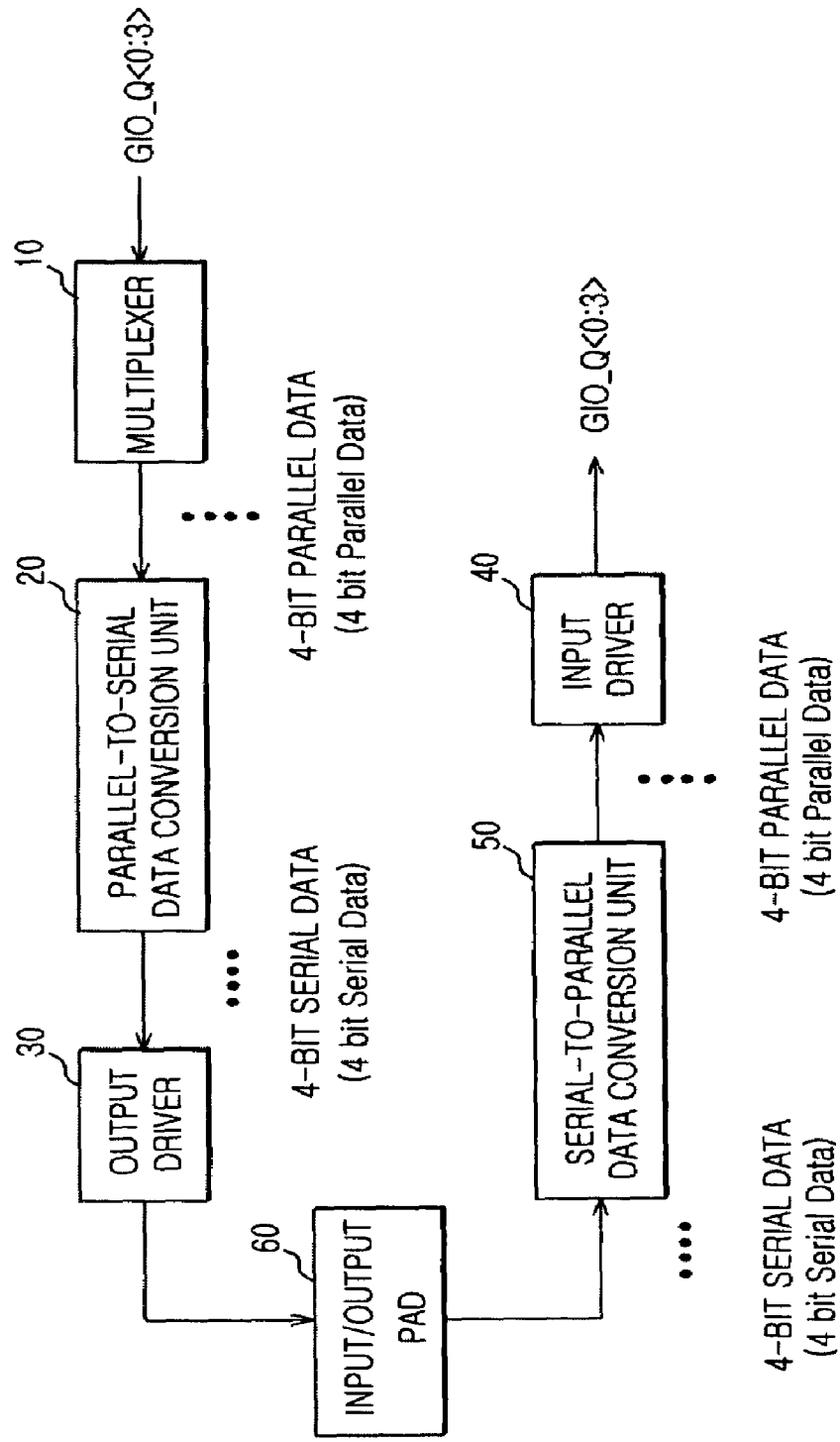
FIG. 1 is a block diagram of a semiconductor memory apparatus to which a conventional data conversion circuit is applied.
Figure 2:
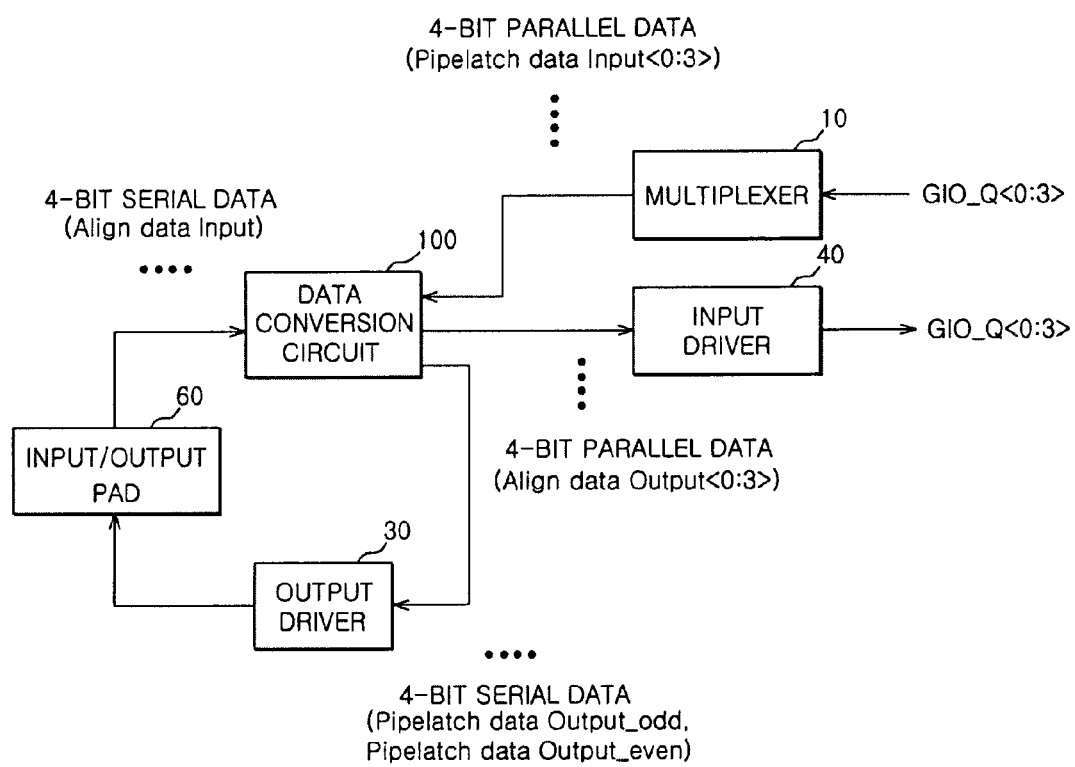
FIG. 2 is a block diagram of a semiconductor memory apparatus to which a data conversion circuit according to an embodiment of the present invention is applied.

Referring to FIG. 2, a semiconductor memory apparatus, to which a data conversion circuit 100 according to an embodiment of the present invention is applied, includes a multiplexer 10, an output driver 30, an input/output pad 60, and an input driver 40.

When a read command is input, the multiplexer 10 transmits 4-bit parallel data Pipelatch data Input<0:3>, which is transmitted from the input/output lines GIO_Q<0:3>, to the data conversion circuit 100. At this time, the data conversion circuit 100 converts the 4-bit parallel data Pipelatch data Input<0:3> to 4-bit serial data Pipelatch data Output_odd and Pipelatch data Output_even. Subsequently, the converted 4-bit serial data Pipelatch data Output_odd and Pipelatch data Output_even are transmitted to the input/output pad 60 through the output driver 30 and then output.

The data conversion circuit 100 converts 4-bit serial data Align data Input, which is input from the input/output pad 60, to 4-bit parallel data Align data Output<0:3> when the write command is input, or converts the 4-bit parallel data Pipelatch data Input<0:3> to the 4-bit serial data Pipelatch data Output_odd and Pipelatch data Output_even when the read command is input.

The input driver 40 transmits the 4-bit parallel data Align data Output<0:3> to the input/output lines GIO_Q<0:3>.

The input/output pad 60 transmits/receives data to/from an external circuit of the semiconductor memory apparatus.

Figure 3:
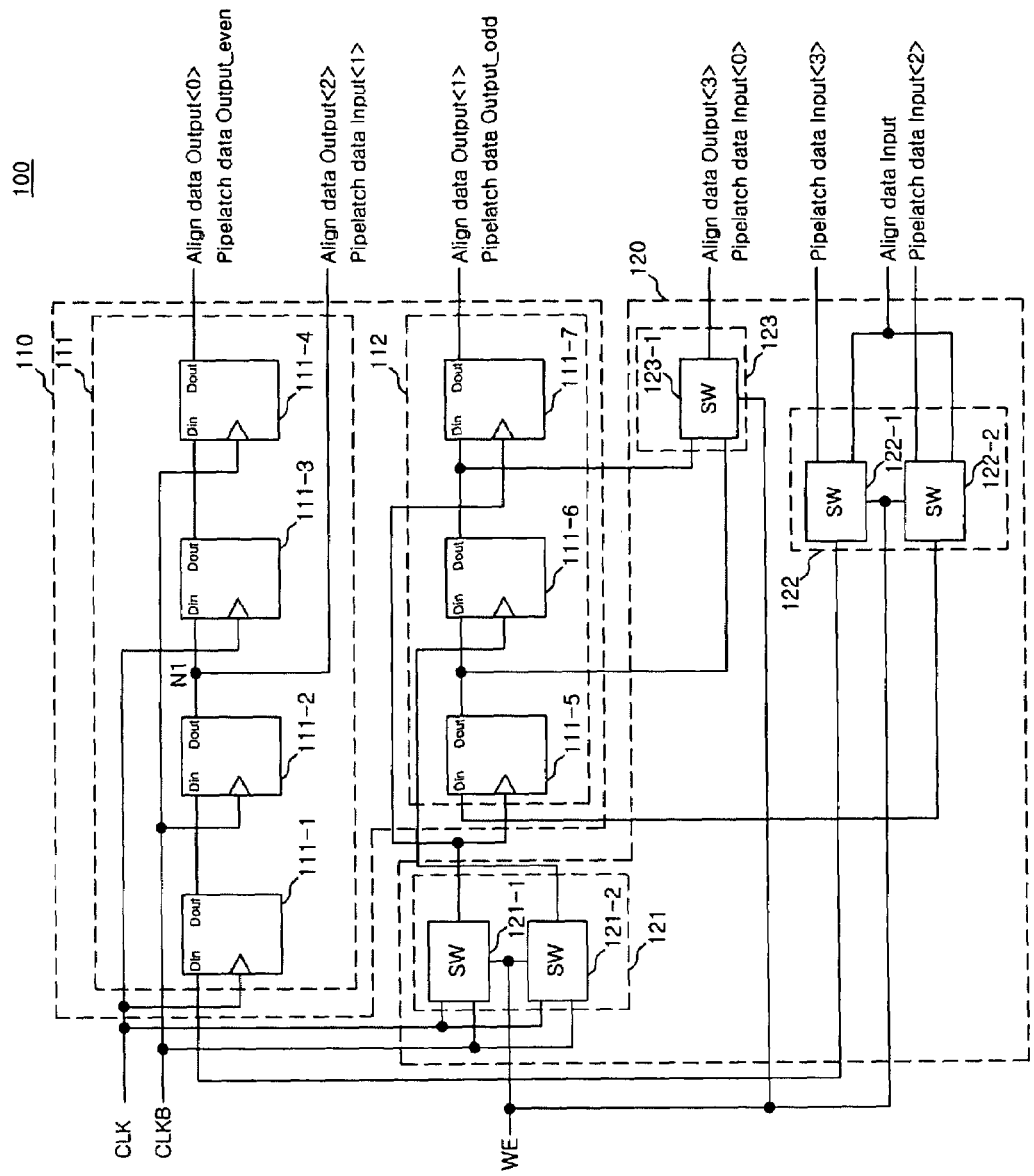
FIG. 3 is a diagram showing the detailed configuration of a data conversion circuit for a semiconductor memory apparatus according to an embodiment of the present invention.

Referring to FIG. 3, the data conversion circuit 100 according to an embodiment of the present invention includes a data conversion unit 110 and an operation mode selection unit 120.

The data conversion unit 110 has a plurality of, for example, seven latches 111-1 to 111-7 that store input data and output the stored input data as output data in response to a clock CLK.

During a first operation mode, that is, a write operation, the data conversion unit 110 sequentially decreases a delay value according to an order in which the serial data Align data Input is input, and outputs the parallel data Align data Output<0:3>. Further, during a second operation mode, that is, a read operation, the data conversion unit 110 receives the parallel data Pipelatch data Input<0:3>, sequentially increases the delay value according to the order of the data input, and outputs the serial data Pipelatch data Output_odd and Pipelatch data Output_even. The delay value is sequentially increased or decreased according to how many latches 111-1 to 111-7 data passes through.

The data conversion unit 110 includes a first data converter 111 and a second data converter 112.

The first data converter 111 includes first to fourth latches 111-1 to 111-4 that store data and output stored data in response to the clock CLK.

The first to fourth latches 111-1 to 111-4 are connected in series and operate in response to the clock CLK or an inverted clock CLKB. The first data converter 111 receives data through an input terminal Din of the first latch 111-1 and outputs data through an output terminal Dout of the fourth latch 111-4. Further, at a node N1 between an output terminal Dout of the second latch 111-2 and an input terminal Din of the third latch 111-3, data is input or output according to the first or second operation mode.

Regardless of the operation mode, the first and third latches 111-1 and 111-3 respond to the clock CLK, and the second and fourth latches 111-2 and 111-4 respond to the inverted clock CLKB.

The first latch 111-1 receives the serial data Align data Input or the parallel data Pipelatch data Input<3> according to the operation mode.

According to the operation mode, the third latch 111-3 receives the parallel data Pipelatch data Input<1> or the second latch 111-2 outputs the parallel data Align data Output<2>.

The fourth latch 111-4 outputs the serial data Pipelatch data Output_even or the parallel data Align data Output<0> according to the operation mode.

The second data converter 112 includes fifth to seventh latches 111-5 to 111-7 that store data and output stored data in response to the clock CLK.

The fifth to seventh latches 111-5 to 111-7 of the second data converter 112 are connected in series and operate in response to the clock CLK.

The latches 111-5 to 111-7 of the second data converter 112 receive the serial data Align data Input, or the parallel data Pipelatch data Input<0> or Pipelatch data Input<2> according to the operation mode. Further, the latches 111-5 to 111-7 output the serial data Pipelatch data Output_odd, or the parallel data Align data Output<1> or Align data Output<3> according to the operation mode.

The fifth latch 111-5 receives the serial data Align data Input or the parallel data Pipelatch data Input<2> according to the operation mode.

During the first operation mode, the fifth latch 111-5 outputs the parallel data Align data Output<3>. Further, during the second operation mode, the seventh latch 111-7 receives the parallel data Pipelatch data Input<0>.

In addition, the seventh latch 111-7 outputs the serial data Pipelatch data Output_odd or the parallel data Align data Output<1> according to the operation mode.

When the write command is input, the operation mode selection unit 120 operates in the first operation mode to convert 4-bit serial data Align data Input to 4-bit parallel data Align data Output<0:3>, to operate the data conversion unit 110. Further, when the read command is input, the operation mode selection unit 120 operates in the second operation mode to convert 4-bit parallel data Pipelatch data Input<0:3> to a pair of 2-bit serial data Pipelatch data Output_odd and Pipelatch data Output_even, to thereby operate the data conversion unit 110. At this time, the operation mode selection unit 120 operates in the first operation mode when the write command is input and operates in the second operation mode when the read command is input.

The operation mode selection unit 120 can use a write enable signal WE, which is used in the general semiconductor memory apparatus, as the read or write command. Accordingly, when the write enable signal WE is enabled, it is determined that the write command is input, and the operation mode is switched to the first operation mode. Meanwhile, when the write enable signal WE is disabled, it is determined that the read command is input, and the operation mode is switched to the second operation mode.

The operation mode selection unit 120 includes first to third selectors 121 to 123.

The first selector 121 selectively outputs the clock CLK and the inverted clock CLKB to the second data converter 112 in response to the write enable signal WE.

The first selector 121 includes a first switching element 121-1 and a second switching element 121-2.

If the write enable signal WE is enabled, the first switching element 121-1 outputs the inverted clock CLKB to the fifth latch 111-5 and the seventh latch 111-7. Further, if the write enable signal WE is disabled, the first switching element 121-1 outputs the clock CLK to the fifth latch 111-5 and seventh latch 111-7.

If the write enable signal WE is enabled, the second switching element 121-2 outputs the clock CLK to the sixth latch 111-6. Further, if the write enable signal WE is disabled, the second switching element 121-2 outputs the inverted clock CLKB to the sixth latch 111-6.

The second selector 122 selectively outputs a part Pipelatch data Input<2> or Pipelatch data Input<3> of the 4-bit parallel data Pipelatch data Input<0:3> or the 4-bit serial data Align data Input to the data conversion unit 110 in response to the write enable signal WE.

The second selector 122 includes a third switching element 122-1 and a fourth switching element 122-2.

The third switching element 122-1 selectively outputs the parallel data Pipelatch data Input<3> or the serial data Align data Input to the input terminal Din of the first latch 111-1 in response to the write enable signal WE.

The third switching element 122-1 outputs the serial data Align data Input to the input terminal Din of the first latch 111-1 if the write enable signal WE is enabled, and outputs the parallel data Pipelatch data Input<3> to the input terminal Din of the first latch 111-1 if the write enable signal WE is disabled.

The fourth switching element 122-2 selectively outputs the parallel data Pipelatch data Input<2> or the serial data Align data Input to the input terminal Din of the fifth latch 111-5 in response to the write enable signal WE.

The fourth switching element 122-2 outputs the serial data Align data Input to the input terminal Din of the fifth latch 111-5 if the write enable signal WE is enabled, and outputs the parallel data Pipelatch data Input<2> to the input terminal Din of the fifth latch 111-5 if the write enable signal WE is disabled.

The third selector 123 inputs the parallel data Pipelatch data Input<0> to the second data converter 112 or outputs the parallel data Align data Output<3> of the second data converter 112 in response to the write enable signal WE.

The third selector 123 includes a fifth switching element 123-1.

If the write enable signal WE is enabled, the fifth switching element 123-1 selects the output terminal Dout of the fifth latch 111-5 and outputs the parallel data Align data Output<3>. Further, if the write enable signal WE is disabled, the fifth switching element 123-1 selects the input terminal Din of the seventh latch 111-7 and inputs the parallel data Pipelatch data Input<0>.

Figure 4:
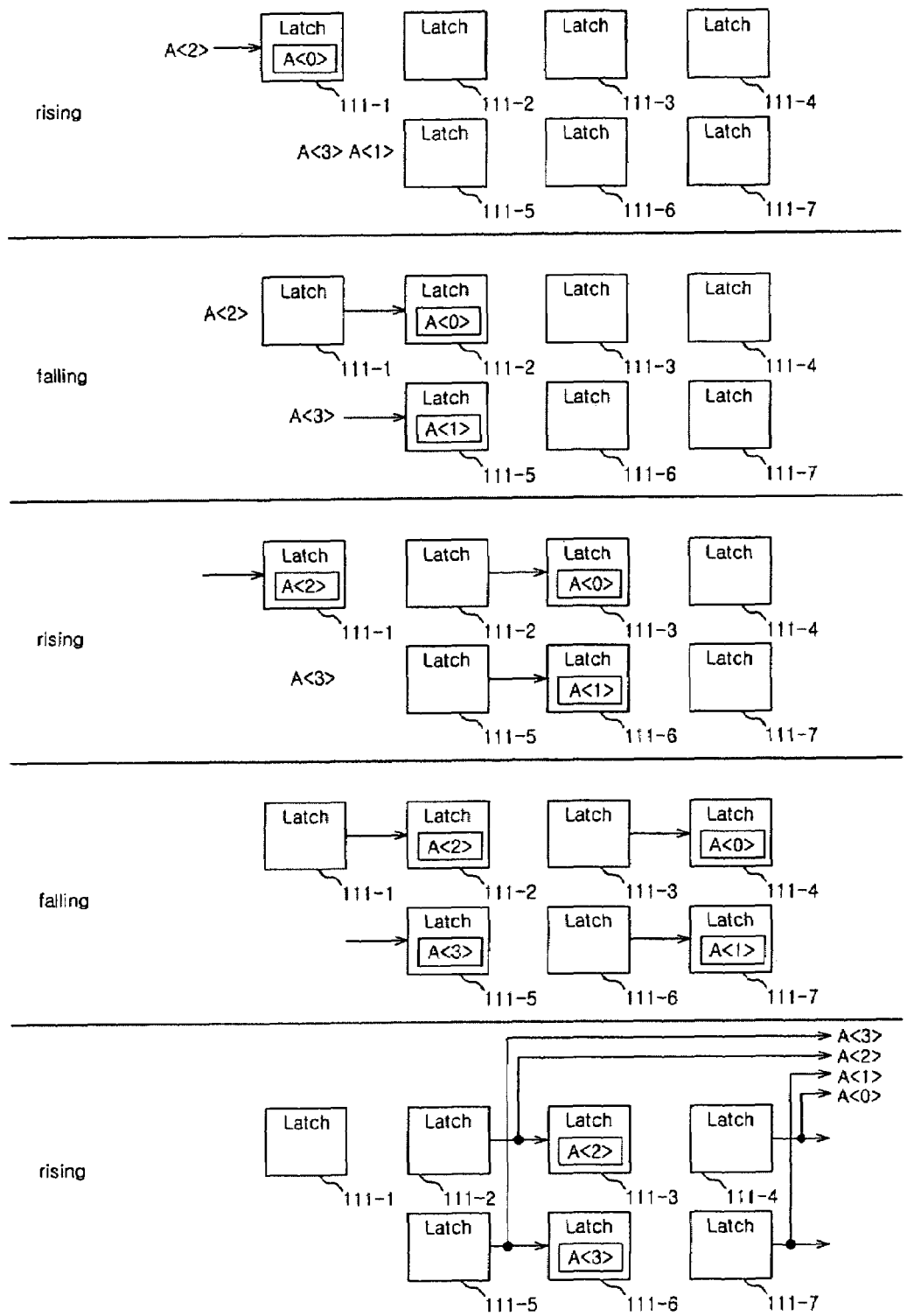
FIG. 4 is a diagram illustrating a data conversion process during a first operation mode in a data conversion circuit according to an embodiment of the present invention.
Figure 5:
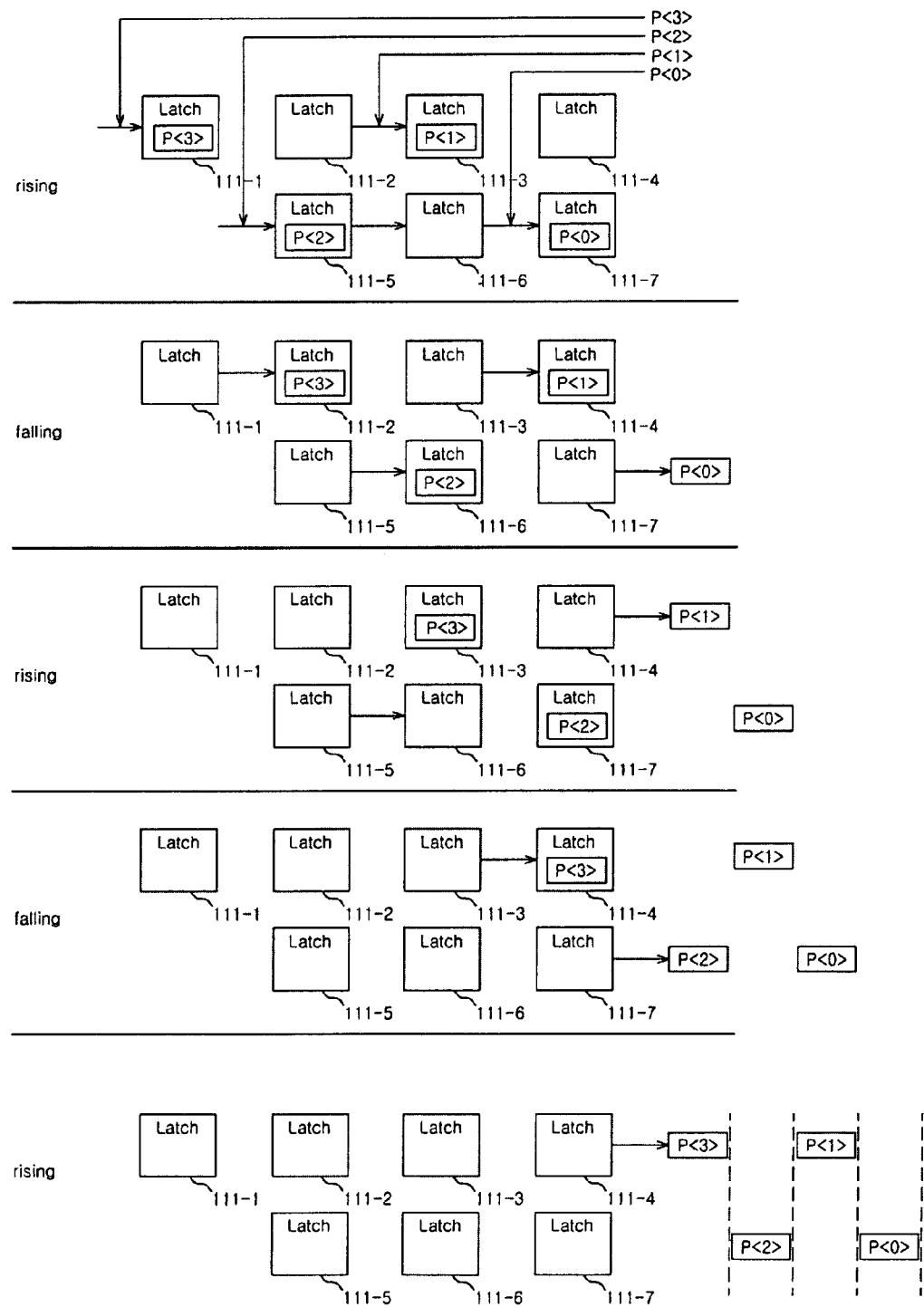
FIG. 5 is a diagram illustrating a data conversion process during a second operation mode in the data conversion circuit according to an embodiment of the present invention.

The operation of the data conversion circuit for a semiconductor memory apparatus according to an embodiment of the present invention having the above-described configuration will be described with reference to FIGS. 4 and 5.

When the write command is input, an operation to convert serial data Align data Input to parallel data Align data Output<0:3> in the first operation mode will be described with reference to FIG. 4.

The first switching element 121-1 inputs the inverted clock CLKB to the fifth and seventh latches 111-5 and 111-7. The second switching element 121-2 inputs the clock CLK to the sixth latch 111-6.

Accordingly, while the fifth and seventh latches 111-5 and 111-7 perform an operation to receive and store data, the sixth latch 111-6 performs an operation to output stored data. Meanwhile, if the fifth and seventh latches 111-5 and 111-17 output stored data, the sixth latch 111-6 receives and stores data. At this time, the first to fourth latches 111-1 to 111-4 receive the clock CLK and the inverted clock CLKB regardless of the operation mode. When the first latch 111-1 receives and stores data, the fifth latch 111-5 outputs stored data.

Third switching element 122-1 outputs the serial data Align data Input to the input terminal Din of the first latch 111-1. The fourth switching element 122-2 outputs the serial data Align data Input to the input terminal Din of the fifth latch 111-5. At this time, first data of the serial data Align data Input is synchronized with the clock CLK to be input to the first latch 111-1. As a result, the first data is synchronized with a rising timing of the clock CLK.

Accordingly, first and third serial data Align data Input of the serial data Align data Input are input to the first latch 111-1 of the first data converter 111, and second and fourth serial data Align data Input of the serial data Align data Input are input to the fifth latch 111-5 of the second data converter 112.

If the clock CLK rises three times, the first serial data Align data Input is output as the parallel data Align data Output<0> through the fourth latch 111-4 of the first data converter 111, and the third serial data Align data Input is output as the parallel data Align data Output<2> through the second latch 111-2.

Meanwhile, the second serial data Align data Input is output as the parallel data Align data Output<1> through the seventh latch 111-7 of the second data converter 112, and the fourth serial data Align data Input is output as the parallel data Align data Output<3> through the fifth latch 111-5 of the second data converter 112.

When the read command is input, an operation to convert parallel data Pipelatch data Input<0:3> to serial data Pipelatch data Output_even and Pipelatch data Output_odd in the second operation mode will be described with reference to FIG. 5.

If the read command is input and the second operation mode is performed, the first switching element 121-1 inputs the clock CLK to the fifth and seventh latches 111-5 and 111-7. The second switching element 121-2 inputs the inverted clock CLKB to the sixth latch 111-6. Accordingly, the first latch 111-1 and the fifth latch 111-5 simultaneously perform an operation to receive and store data and an operation to output data.

The third switching element 122-1 inputs the parallel data Pipelatch data Input<3> to the input terminal Din of the first latch 111-1, and the fourth switching element 122-2 inputs the parallel data Pipelatch data Input<2> to the input terminal Din of the fifth latch 111-5.

The input terminal Din of the seventh latch 111-7 is selected through the fifth switching element 123-1, and the parallel data Pipelatch data Input<0> is input to the input terminal Din of the seventh latch 111-7. At this time, the parallel data Pipelatch data Input<1> is input to the input terminal Din of the third latch 111-3 in the first data converter 111.

The serial data Pipelatch data Output_even is output from the first data converter 111, and the serial data Pipelatch data Output_odd is output from the second data converter 112. Specifically, if the clock CLK is toggled for a first time, the parallel data Pipelatch data Input<0> stored in the seventh latch 111-7 is output as the serial data Pipelatch data Output_odd. If the clock CLK is toggled a second time, the parallel data Pipelatch data Input<1> stored in the third latch 111-3 is output as the serial data Pipelatch data Output_even. Further, if the clock CLK is toggled a third time, the parallel data Pipelatch data Input<2> stored in the fifth latch 111-5 is output as the serial data Pipelatch data Output_odd. If the clock CLK is toggled a fourth time, the parallel data Pipelatch data Input<3> stored in the first latch 111-1 is output as the serial data Pipelatch data Output_even. As a result, the output driver 30 shown in FIG. 2 outputs 2-bit serial data Pipelatch data Output_odd and Pipelatch data Output_even as 4-bit serial data Pipelatch data Output.

The operation of the data conversion circuit according to an embodiment of the present invention in the first operation mode will be described in detail with reference to FIG. 4. During the first operation mode, 4-bit serial data Align data Input stored in and 4-bit parallel data Align data Output<0:3> output from the first to seventh latches 111-1 to 111-7 are simply represented as A<0:3>.

Each time the clock CLK is toggled, the latches 111-1 to 111-7 store data or output stored data.

If the clock CLK is toggled for a first time (rises), the first latch 111-1 stores serial data A<0>.

If the clock CLK is toggled a second time (falls), the serial data A<0> is stored in the second latch 111-2, and at the same time, serial data A<1> is stored in the fifth latch 111-5.

If the clock CLK is toggled a third time (rises), the serial data A<0> is stored in the third latch 111-3, and at the same time, the serial data A<1> is stored in the sixth latch 111-6. In addition, the serial data A<2> is stored in the first latch 111-1.

If the clock CLK is toggled a fourth time (falls), the serial data A<0> is stored in the fourth latch 111-4, and at the same time, the serial data A<1> is stored in the seventh latch 111-7. In addition, the serial data A<2> is stored in the second latch 111-2, and the serial data A<3> is stored in the fifth latch 111-5.

If the clock CLK is toggled a fifth time (rises), the serial data A<0:3> is simultaneously output as the parallel data shown in FIG. 2 to the input driver 40. At this time, the serial data A<2> and A<3> are stored in the third and sixth latches 111-3 and 111-6, respectively.

The operation of the data conversion circuit according to an embodiment of the present invention in the second operation mode will be described in detail with reference to FIG. 5. At this time, 4-bit parallel data Pipelatch data Input<0:3> stored in and 4-bit serial data Pipelatch data Output_odd and Pipelatch data Output_even output from the first to seventh latches 111-1 to 111-7 during the second operation mode are simply represented as P<0:3>.

Each time the clock CLK is toggled, the latches 111-1 to 111-7 store data or output stored data. Further, the first data converter 111 and the second data converter 112 also perform an operation to store data or to output data each time the clock CLK is toggled.

If the clock CLK is toggled for a first time (rises), parallel data P<3>, parallel data P<1>, parallel data P<2>, and parallel data P<0> are simultaneously stored in the first latch 111-1, the third latch 111-3, the fifth latch 111-5, and the seventh latch 111-7, respectively.

If the clock CLK is toggled a second time (falls), the parallel data P<0> stored in the seventh latch 111-7 is output as serial data. At this time, the fourth latch 111-4 stores the parallel data P<1>, and the sixth latch 111-6 stores the parallel data P<2>. The second latch 111-2 simultaneously stores the parallel data P<3>.

If the clock CLK is toggled a third time (rises), the parallel data P<1> stored in the fourth latch 111-4 is output as the serial data. At this time, the third latch 111-3 stores the parallel data P<3>, and at the same time, the seventh latch 111-7 stores the parallel data P<2>.

If the clock CLK is toggled a fourth time (falls), the parallel data P<2> stored in the seventh latch 111-7 is output as the serial data. At this time, the parallel data P<3> is stored in the fourth latch 111-4.

If the clock CLK is toggled a fifth time (rises), the parallel data P<3> stored in the fourth latch 111-4 is output as the serial data.

In this manner, the parallel data P<0:3> is output to the output driver 30 as the serial data.

The data conversion circuit of a semiconductor memory apparatus and the semiconductor memory apparatus using the same according to an embodiment of the present invention can convert parallel data to serial data or convert serial data to parallel data using a single data conversion unit. Therefore, the size of the semiconductor memory apparatus can be reduced.

It will be apparent to those skilled in the art that various modifications and changes may be made without departing from the scope and spirit of the present invention. Therefore, it should be understood that the above embodiment is not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

What is claimed is:

1. A data conversion circuit for a semiconductor memory apparatus comprising:
    a data conversion unit that includes a plurality of latches for storing input data and outputting stored data as output data in response to a clock; and
    an operation mode selection unit that selects either a first operation mode to convert serial data to parallel data during a write operation or a second operation mode to convert parallel data to serial data during a read operation, to control the data conversion unit,
    wherein at least one of the plurality of latches selectively receives the serial data as the input data in the first operation mode and receives the parallel data as the input in the second operation mode, wherein, during the first operation mode, the data conversion unit sequentially decreases a delay value according to an order in which the serial data is input, and outputs the parallel data, and
    during the second operation mode, the data conversion unit receives the parallel data, sequentially increases the delay value according to the order, and sequentially outputs the serial data.

2. The data conversion circuit of claim 1,
    wherein the data conversion unit includes first and second data converters, each having a plurality of latches connected in series, and the clock and an inverted clock are input to alternate ones of the plurality of latches.

3. The data conversion circuit of claim 2,
    wherein the first data converter has first to fourth latches, and
    the second data converter has fifth to seventh latches.

4. The data conversion circuit of claim 3,
    wherein, in the first data converter, the clock is input to the first and third latches, and the inverted clock is input to the second and fourth latches.

5. The data conversion circuit of claim 4,
    wherein, in the first data converter, the first and third latches includes input terminals that serve as an input terminal of the first data converter, and the second and fourth latches include output terminals that serve as an output terminal of the first data converter.

6. The data conversion circuit of claim 5,
    wherein, during the first operation mode, the first data converter receives the serial data through the input terminal of the first latch, and outputs the parallel data through the output terminals of the second latch and the fourth latch, and
    during the second operation mode, the first data converter receives the parallel data through the input terminal of the first latch and the input terminal of the third latch, and outputs the serial data through the output terminal of the fourth latch.

7. The data conversion circuit of claim 3,
    wherein, in the second data converter, during the first operation mode, the clock is input to the fifth and seventh latches, and the inverted clock is input to the sixth latch, and
    during the second operation mode, the inverted clock is input to the fifth and seventh latches, and the clock is input to the sixth latch.

8. The data conversion circuit of claim 7,
    wherein, in the second data converter, the fifth and seventh latches include input terminals that serve as an input terminal of the second data converter, and the fifth and seventh latches include output terminals that serve as an output terminal of the second data converter.

9. The data conversion circuit of claim 8,
    wherein, during the first operation mode, the second data converter receives the serial data through the input terminal of the fifth latch, and outputs the parallel data through the output terminal of the fifth latch and the output terminal of the seventh latch.

10. The data conversion circuit of claim 9,
    wherein, during the second operation mode, the second data converter receives the parallel data through the input terminal of the fifth latch and the input terminal of the seventh latch, and outputs the serial data through the output terminal of the seventh latch.

11. The data conversion circuit of claim 1,
wherein the operation mode selection unit includes:
a first selector that outputs an inverted clock or the clock according to the first operation mode or the second operation mode,
a second selector that selectively outputs a part of the serial data or the parallel data to the data conversion unit according to the first operation mode or the second operation mode, and
a third selector that selects an input terminal or an output terminal of the data conversion unit according to the first operation mode or the second operation mode.

12. The data conversion circuit of claim 11,
wherein the first selector has first and second switching elements that respond to a write enable signal.

13. The data conversion circuit of claim 12,
wherein, in the first selector, the first switching element outputs the inverted clock if the write enable signal is enabled, and the second switching element outputs the clock if the write enable signal is enabled.

14. The data conversion circuit of claim 13,
wherein, in the first selector, the first switching element outputs the clock if the write enable signal is disabled, and the second switching element outputs the inverted clock if the write enable signal is disabled.

15. The data conversion circuit of claim 11,
wherein the second selector includes first and second switching elements that respond to a write enable signal.

16. The data conversion circuit of claim 15,
wherein, in the second selector, the first and second switching elements output the serial data to the data conversion unit if the write enable signal is enabled.

17. The data conversion circuit of claim 16,
wherein, in the second selector, the first and second switching elements output the part of the parallel data to the data conversion unit if the write enable signal is disabled.

18. The data conversion circuit of claim 11,
wherein the third selector has a switching element that responds to a write enable signal.

19. The data conversion circuit of claim 18,
wherein, in the third selector, the switching element outputs the output data of the data conversion unit as the parallel data if the write enable signal is enabled.

20. The data conversion circuit of claim 19,
wherein, in the third selector, the switching element outputs the part of the parallel data to the data conversion unit if the write enable signal is disabled.

21. A semiconductor memory apparatus comprising:
an input/output pad through which data is input or output;
an input driver that outputs the data to input/output lines;
an output driver that outputs the data to the input/output pad; and
a data conversion circuit that has a plurality of latches, simultaneously outputs data, which is sequentially output from the input/output pad by one bit at a time, to the input driver during a write operation, and sequentially outputs data, which is simultaneously output from the input/output lines, to the output driver by one bit at a time during a read operation,
wherein at least one of the plurality of latches selectively receives the data which is output from the input/output pad in the write operation and receives the data which is output from the input/output lines in the read operation,
wherein, during the write operation, the data conversion circuit sequentially increases a delay value by one bit at a time according to an order and simultaneously outputs the data.

22. The semiconductor memory apparatus of claim 21,
wherein, during the read operation, the data conversion circuit simultaneously receives the data, sequentially decreases a delay value according to an order, and sequentially outputs the data.

23. The semiconductor memory apparatus of claim 21,
wherein, in the data conversion circuit, the plurality of latches are connected in series to operate in response to a clock, and
a delay value is determined according to how many latches one-bit data passes through.

24. The semiconductor memory apparatus of claim 23,
wherein the data conversion circuit includes
a data converter that has the plurality of latches and an input terminal and an output terminal, and
a controller that controls the input terminal and the output terminal of the data converter to increase the delay value during the write operation or decrease the delay value during the read operation.

25. The semiconductor memory apparatus of claim 24,
wherein the data converter includes first to fourth latches connected in series, and
the clock and an inverted clock are input to alternate ones of the plurality of latches.

26. The semiconductor memory apparatus of claim 25,
wherein, in the data converter, the first latch includes an input terminal that serves as the input terminal of the data converter, and the second and fourth latches include output terminals that serve as the output terminal of the data converter during the write operation.

27. The semiconductor memory apparatus of claim 26,
wherein, in the data converter, the third latch includes an input terminal, and during the read operation, the input terminals of the first latch and the third latch serve as the input terminal of the data converter, and the output terminal of the fourth latch serves as the output terminal of the data converter.

28. The semiconductor memory apparatus of claim 27,
wherein, during the write operation, the controller selects the input terminal of the first latch and the output terminals of the second latch and the fourth latch as the input terminal and the output terminal of the data converter, respectively, and
during the read operation, the controller selects the input terminals of the first latch and the third latch and the output terminal of the fourth latch as the input terminal and the output terminal of the data converter, respectively.

29. The semiconductor memory apparatus of claim 28,
wherein the controller includes a switching element that selects the output terminal of the second latch during the write operation and selects the input terminal of the third latch during the read operation.

* * * * *